(12) United States Patent
Edwards

(10) Patent No.: US 7,592,816 B2
(45) Date of Patent: Sep. 22, 2009

(54) LOCALIZER CABLE FAULT ANALYZER

(75) Inventor: Steven William Edwards, Keller, TX (US)

(73) Assignee: Federal Aviation Administration, Washington, DC (US)

( * ) Notice: Subject to any disclaimer, the term of this patent is extended or adjusted under 35 U.S.C. 154(b) by 584 days.

(21) Appl. No.: 11/500,331

(22) Filed: Aug. 8, 2006

(65) Prior Publication Data

US 2009/0115662 A1    May 7, 2009

Related U.S. Application Data

(60) Provisional application No. 60/706,758, filed on Aug. 10, 2005.

(51) Int. Cl.
*G01R 31/08* (2006.01)
*G01R 31/02* (2006.01)
*H01Q 21/00* (2006.01)
*G01S 1/16* (2006.01)

(52) U.S. Cl. ................... 324/512; 324/539; 343/810; 342/413

(58) Field of Classification Search ............... 324/512; 342/413
See application file for complete search history.

(56) References Cited

U.S. PATENT DOCUMENTS

| 4,032,920 | A | * | 6/1977 | Martin et al. .............. 342/413 |
| 6,052,266 | A | * | 4/2000 | Aromin ....................... 361/49 |
| 6,122,261 | A | * | 9/2000 | Fernandes et al. ............ 370/320 |
| 6,600,332 | B2 | * | 7/2003 | Tsai .............................. 324/763 |

* cited by examiner

*Primary Examiner*—Timothy J Dole
*Assistant Examiner*—Jeff Natalini
(74) *Attorney, Agent, or Firm*—Martin E. Robinson, Jr.; James J. Drew

(57) ABSTRACT

A Localizer cable fault analyzer that memorizes which antenna in a Localizer antenna array caused a fault. The Localizer equipment monitors the antenna transmit and monitor cables for continuity using a DC voltage. The present invention senses the voltage drop on the antenna circuit when a fault occurs and causes an indicator device to signal the presence of the fault in that particular antenna circuit. The indicator device continues to signal the presence of a fault until a reset switch is activated.

4 Claims, 16 Drawing Sheets hole sizes:
A = .13 4/40 screws
B = .39 rubber grommet

LEFT SIDE OF CASE hole sizes:
A = 0.13  4/40 screws for battery holder
C = 0.18  battery leads 1
2
3
4
5
6
7
8
9
10

(Solder pad side shown)
RadioShack Dual PC Board part #276-148 (breaks in half to make 2).

LOCALIZER CABLE FAULT ANALYZER

CROSS REFERENCE TO RELATED APPLICATIONS

This application claims the priority benefit of U.S. Provisional Application No. 60/706,758 filed on Aug. 10, 2005, which is incorporated herein by reference.

STATEMENT OF GOVERNMENT INTEREST

The present invention may be made or used by or for the Government of the United States without the payment of any royalties thereon.

FIELD OF THE INVENTION

Localizer antenna arrays are provided at the end of major runways at major airports. Their correct operation is critical to air traffic safety. The present invention relates to the detection of cable faults in the Localizer antenna array.

BACKGROUND

The Localizer is part of the Instrument Landing System (ILS). The ILS is a ground based precision approach system that provides course and vertical guidance to landing aircraft. The Localizer is the component of the ILS that provides course guidance to the runway. The Localizer is located at the end of the runway. The Localizer equipment has 8, 14, or 20 antenna elements wired in an array. The number of antennas in the array depends on whether the airport has close or parallel runways, or if there are building obstructions near the runways. In these cases, the radiated signal pattern must be narrowed. Increasing the number of antennas in the array narrows the radiated signal pattern. All the proper signals have to be radiated from all the antennas to give a pilot the correct left-to-right indication on his instruments. A fault in the cable feeding an antenna will cause the Localizer system to shut down, and the pilot will lose the Localizer signal that could possibly result in an unsafe condition during final approach to landing.

The Localizer equipment generates a DC voltage that is present at all times in all the antenna lines in the antenna array. When the Localizer equipment is operating normally, a cable fault card in the equipment generates an audio tone and sends it back to the Localizer equipment shelter. When a cable fault occurs, the DC voltage on that particular antenna line goes to zero, and the cable fault card has group of circuits that detect this condition. When the DC voltage goes to zero on any of the antenna lines, the audio tone is inhibited and the Localizer monitor generates a cable fault alarm. However, the Localizer monitor does not identify which antenna in the array caused the fault.

Troubleshooting to find the fault requires the technician to measure voltages at a test point with a voltmeter to determine which antenna or feed line is has the fault which caused the Localizer system to shut down. The problem is compounded if the fault is intermittent. An intermittent fault can take hours or even days to troubleshoot. The technician has to be on the proper test point and actually see the voltage drop with a voltmeter to identify the antenna. The technician must start at one end of the antenna array and check every connector. In a 20-element antenna array there are 80 connectors. There have been instances where an antenna array was completely recabled, and upon the completion, the problem was still present.

SUMMARY OF THE INVENTION

The present invention is capable of memorizing which antenna in the Localizer antenna array caused a fault. The Localizer equipment monitors the antenna transmit and monitor cables for continuity using a DC voltage. This DC voltage is present along with RF signals to and from all the antennas in the antenna array. If there is an open or short circuit condition or a faulty antenna, the DC voltage goes to zero and the Localizer equipment generates a cable fault alarm. The present invention connects to the Localizer equipment before the circuitry that generates the cable fault alarm.

The present invention comprises 20 separate detection and capture circuits for monitoring up to 20 antennas in a Localizer antenna array. Each detection and capture circuit comprises a buffer circuit coupled to a digital latch circuit and an indicator device such as a light emitting diode (LED), light bulb, breaker button, etc. When connected to the Localizer equipment, the present invention senses the voltage drop on the antenna circuit when a fault occurs and causes the indicator device to signal the occurrence of the fault in that particular antenna circuit. The indicator device continues to signal the occurrence of a fault until a reset switch is activated.

DETAILED DESCRIPTION OF THE EMBODIMENTS

The present invention is a diagnostic Localizer cable fault analyzer that automatically detects and memorizes which antenna in a Localizer antenna array has caused a fault. The present invention allows troubleshooting to be focused on the particular antenna and related transmit and monitor cables causing the fault. This results in shortened outage times and allows the Localizer system to be returned to service faster.

Figure 1:
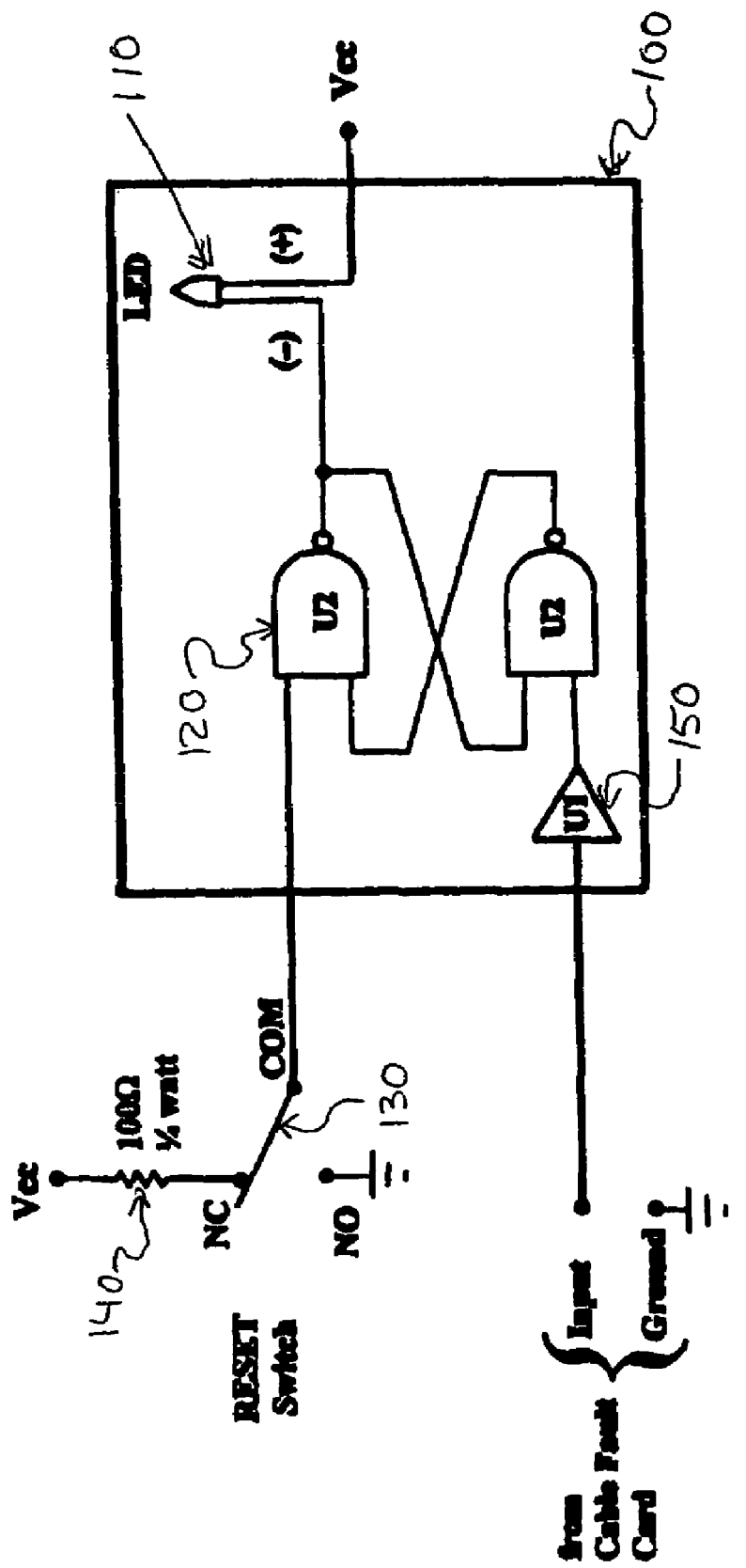
FIG. 1 is a schematic diagram of an example embodiment of the present invention, a Localizer cable fault analyzer.
Figure 2:
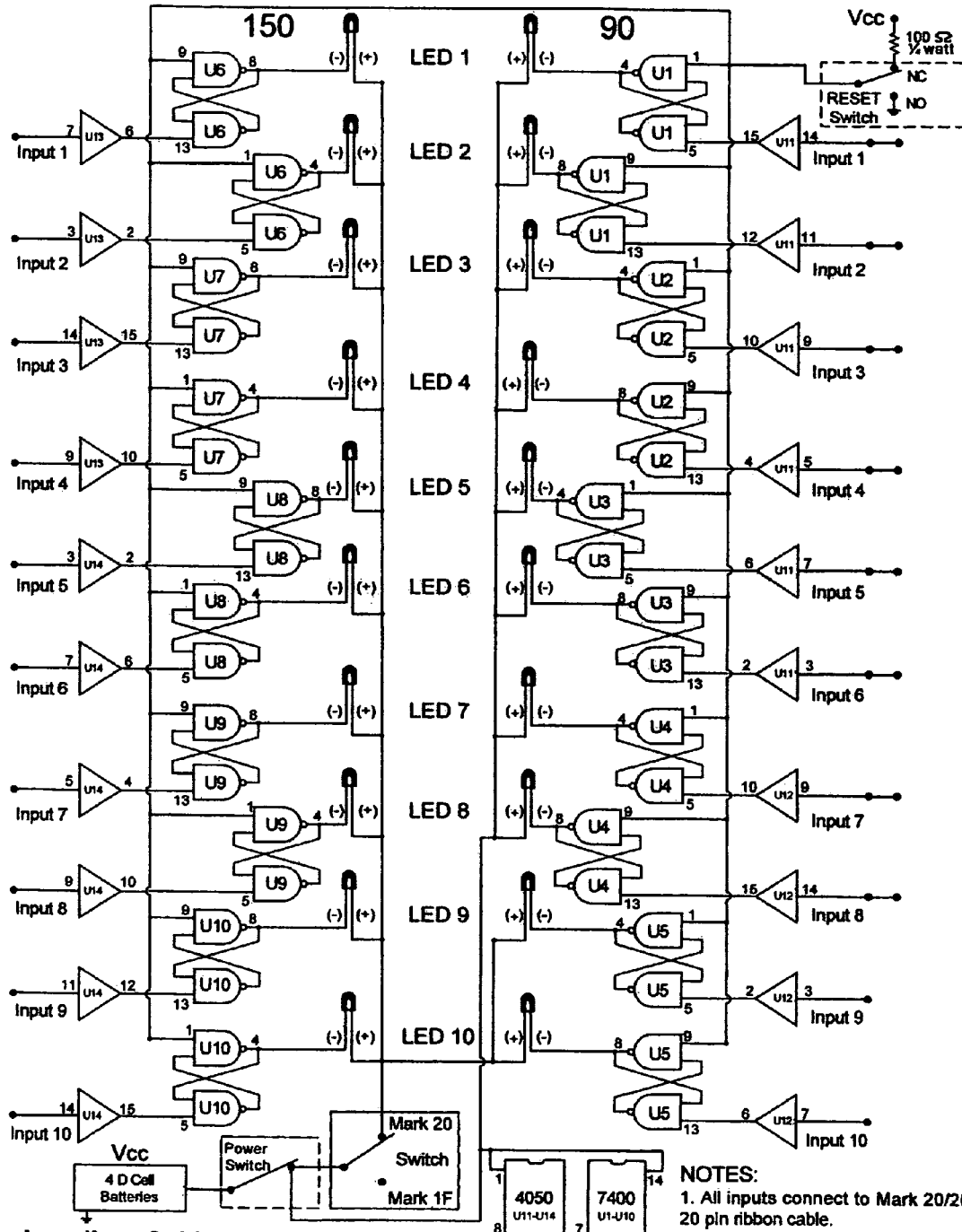
FIG. 2 is a schematic diagram of an example embodiment of the present invention configured for use on a 20-antenna Localizer antenna array.

The existing Localizer equipment in the field typically has 8, 14, or 20 antennas wired in pairs. Referring to FIG. 1, the present invention includes a separate detection and capture circuit 100 to monitor each respective antenna in the Localizer antenna array to detect and memorize which antenna in the Localizer antenna array caused a fault. For example, an 8 antenna Localizer antenna array would require 8 detection and capture circuits, a 14 antenna Localizer antenna array would require 14 detection and capture circuits, and a 20 antenna Localizer antenna array would require 20 detection and capture circuits. FIG. 2 is a schematic diagram of an example embodiment of the present invention configured for use on a 20-antenna Localizer antenna array.

The example detection and capture circuit 100 in FIG. 1 may include a light emitting diode (LED) 110 to act as an indicator device to indicate that a fault has been detected. If the LED lights during a detection and capture operation, it would indicate that a fault has occurred in the antenna associated with that detection and capture circuit. Any other type of indicator such as a light bulb, breaker button, etc. may also be used as an indicator device.

The example detection and capture circuit 100 depicted in FIG. 1 uses a digital latching circuit 120 comprising a pair of cross coupled NAND gates. One input (i.e., upper) to the latching circuit 120 is coupled to the common terminal of a reset switch 130 which can be selected to a normally open (NO) terminal to apply ground to reset the latch, or, alternatively, selected to a normally closed (NC) terminal to apply a predetermined voltage, $V_{cc}$, through a resistor 140 to bias the latch into the select and capture mode. An opposite (i.e., lower) input to the latching circuit 120 is coupled to a suitable monitoring point on the Localizer equipment. A buffer circuit 150 is included between the input to the latching circuit 120 and the monitoring point on the Localizer equipment. The buffer circuit 150 prevents the present invention from causing alarms in the Localizer equipment.

In operation, the Localizer equipment monitors the antenna transmit and monitor cables for continuity using a DC voltage. This DC voltage is present on the cables along with the RF signals to and from all the antennas. If there is an open or short circuit, or a faulty antenna, the DC voltage goes to zero and the Localizer equipment generates a cable alarm. The present invention connects to the Localizer equipment before the circuitry that generates the cable fault alarm. When the DC voltage at the monitoring point on the Localizer equipment goes to zero (i.e., ground), the LED 110 instantly lights and stays lit to indicate that a fault has been detected in the antenna associate with that particular LED. The LED can be extinguished using the reset switch 130.

The present invention can be connected "on-the-fly" while the Localizer is transmitting without interfering with the Localizer's operation. Also, the present invention may remain connected to the Localizer for extended periods and act as a long term monitor. With this long term monitoring capability, the present invention will immediately detect and report an intermittent cable fault. The present invention can also be used proactively to rule out an antenna array if a cable fault occurs and no LEDs light.

As mentioned previously, typical pre-existing Localizers have 8, 14, or 20 antennas wired in pairs. While three separate (8, 14, and 20-antenna) versions of the present may be constructed, it is more advantages to construct a single twenty antenna version of the present invention which can be used to fault analyze any of the 8, 14, or 20 antenna Localizers. FIG. 2 is a schematic diagram for a 20 antenna version of the present invention.

Figure 3:
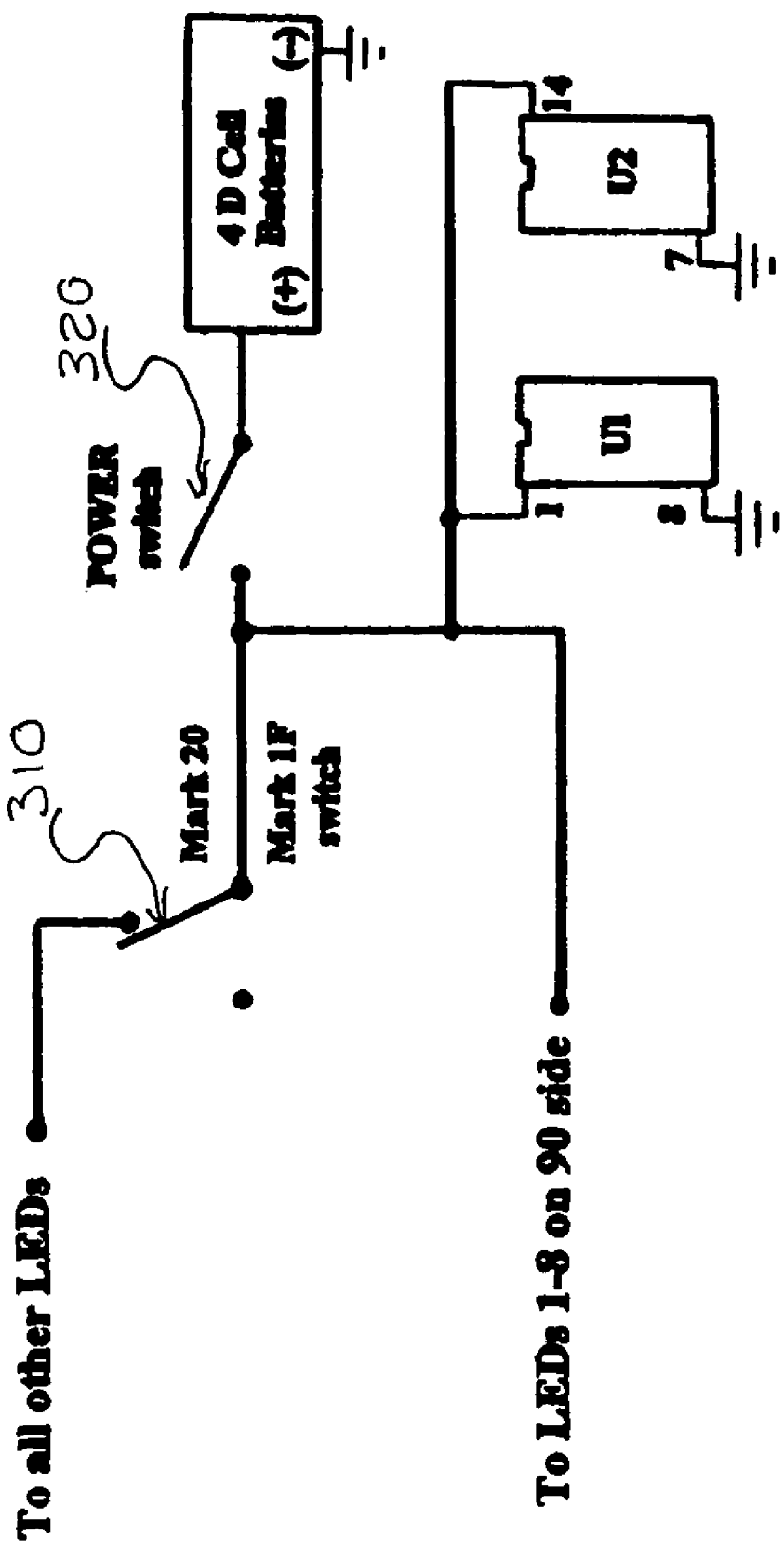
FIG. 3 is an example block diagram of a LED inhibiting circuit for a 20-antenna embodiment of the present invention.

When a 20-antenna version of the present invention is connected to diagnose an 8-antenna Localizer such as a Wilcox Mark 1F, it is best to inhibit the LEDs of any of the extra unused circuits to prevent confusion and save battery power. FIG. 3 shows a block diagram of an example LED inhibiting circuit where a switch 310 can be selected to disable LEDs 9 through 20 when fault analyzing an 8-antenna localizer, or alternatively enable LEDs 9 through 20 when fault analyzing a 14 or 20-antenna such as a Wilcox/Thales Mark 20/20A. This example configuration is battery powered allowing portability and includes a main power switch 320. When the power switch 320 is closed, buffer device U1 and latch device U2 receive steady power.

Figure 4:
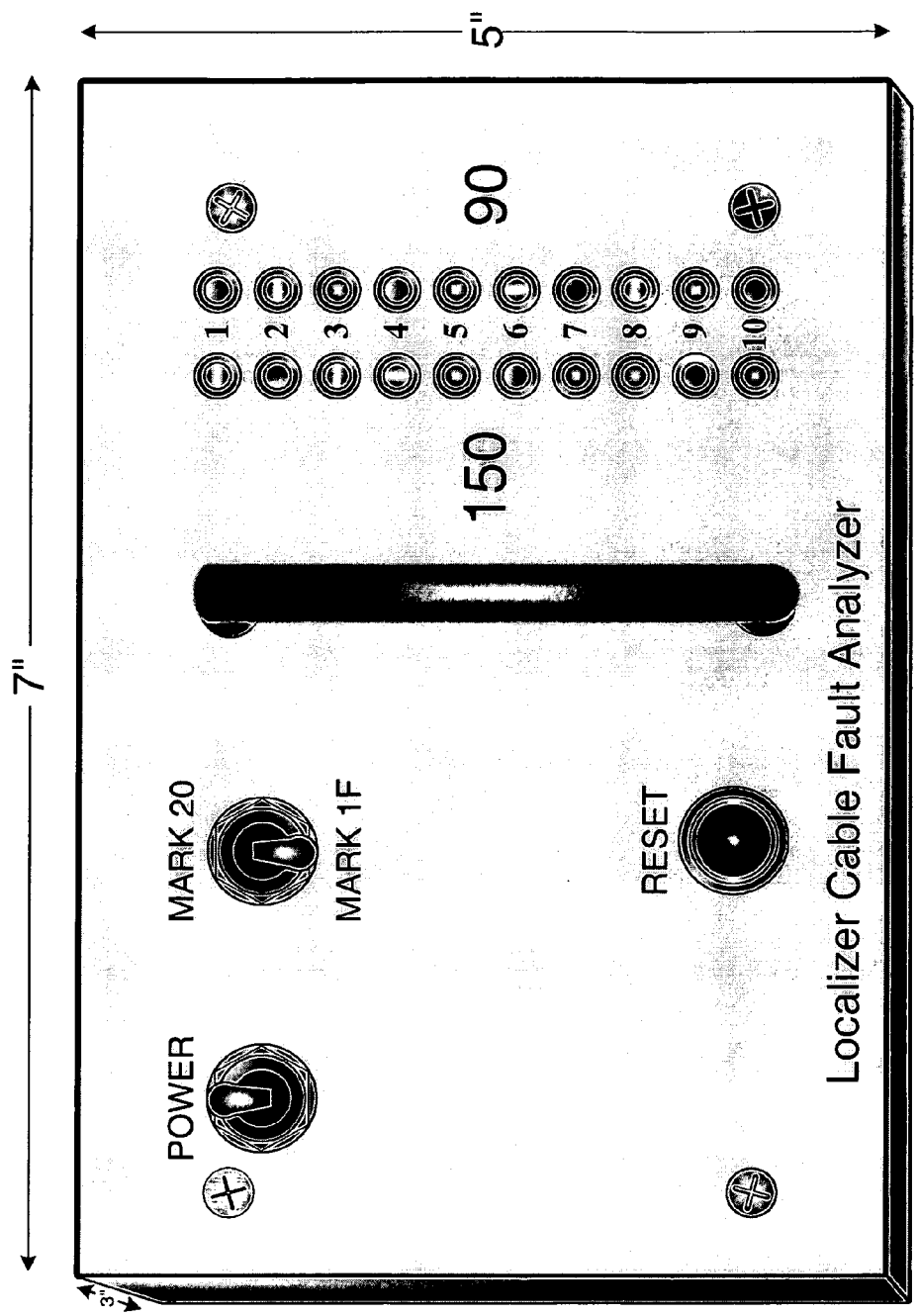
FIG. 4 is a photograph of a 20-antenna example embodiment of the present invention.
Figure 5:
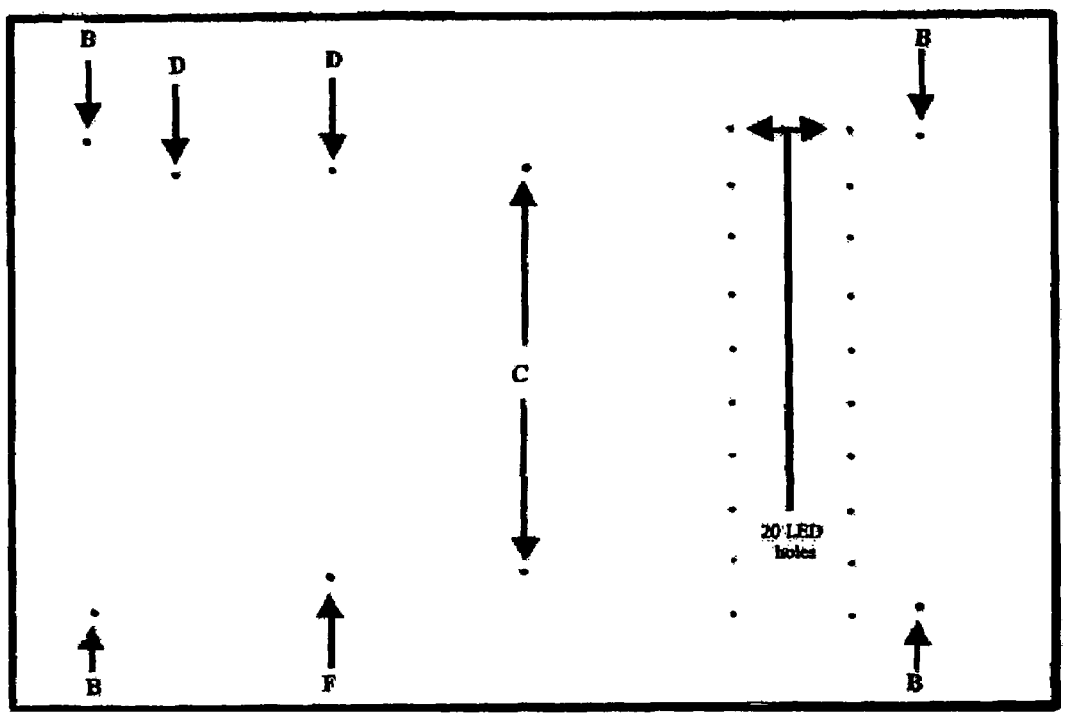
FIGS. 5 through 10 are illustrations of case layouts for a 20-antenna example embodiment of the present invention.
Figure 6:
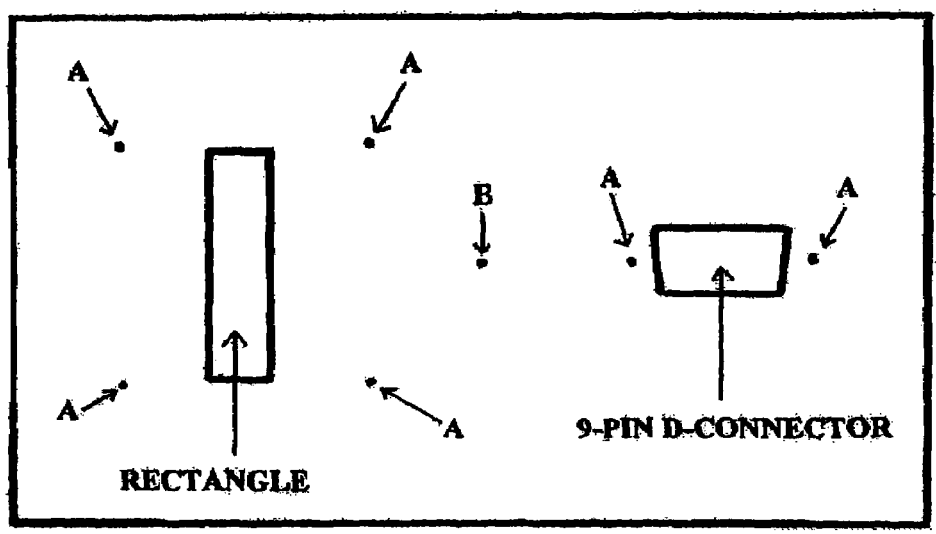
Figures 7, 8:
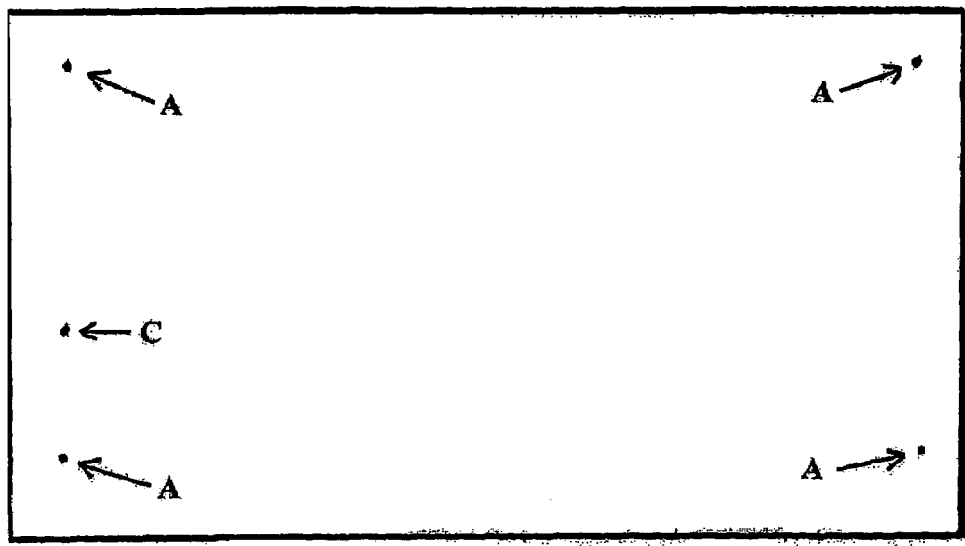
Figure 9:
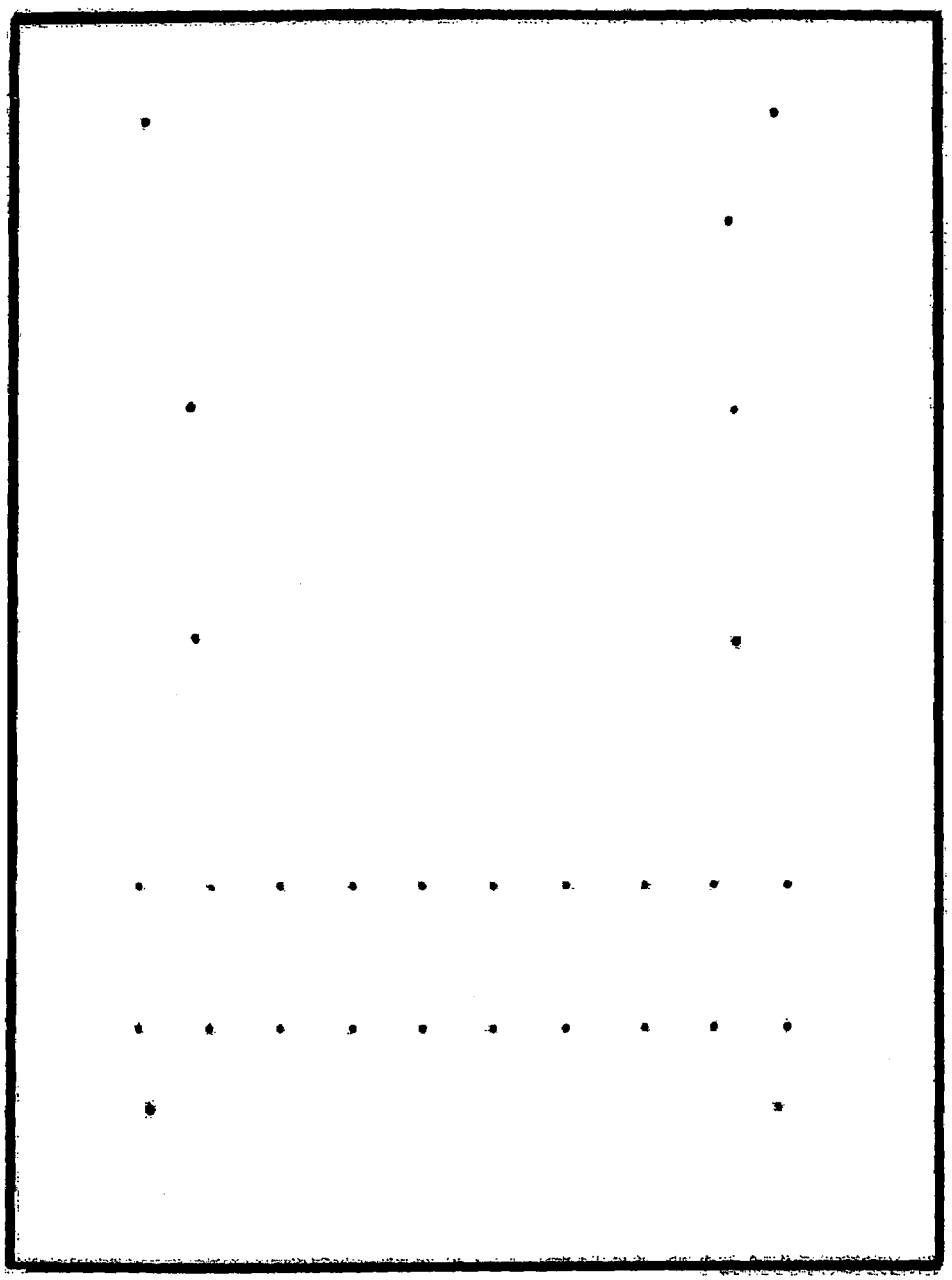
Figure 10:
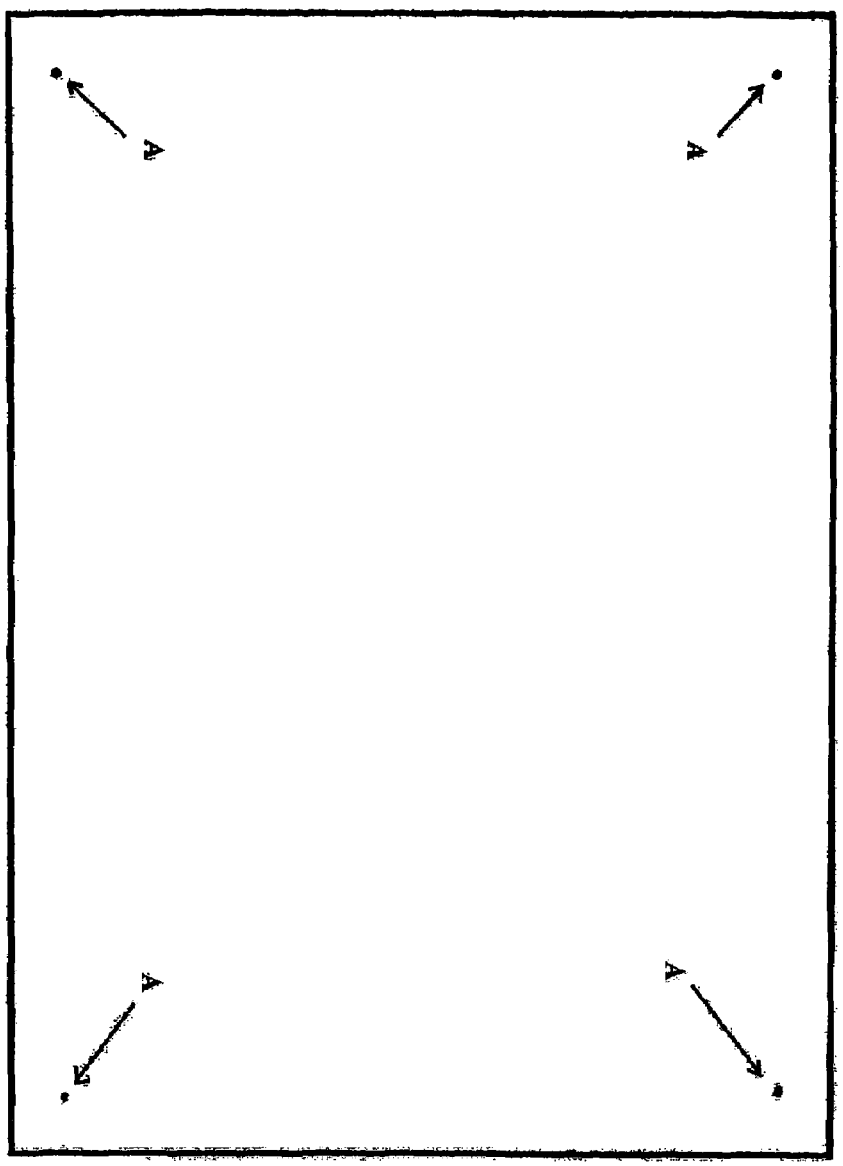

FIG. 4 shows an example embodiment of a 20-antenna version of the present invention. The top panel of the enclosure has a power switch, a reset switch, a selector switch to select between 8-antenna and 14/20-antenna Localizers, and 20 LEDs arranged in a double row of 10. A self-test function is included on the side of the enclosure to check all of the digital gates and LEDs. Inside, the enclosure contains a printed circuit board with 14 integrated circuits, one resistor, and the internal wiring.

The following is a parts list for construction a 20-antenna example embodiment of the present invention:

| Quantity | | Mouser part # | (extended quantity for 10) |
|---|---|---|---|
| 1 | Chassis box | 537-TF-782 | 10 |
| 1 | Battery Holder, 4 D cells | 12BH146 | 10 |
| 2 | Toggle switch, SPST | 10TC320 | 20 |
| 1 | Push button switch, SPST | 10PA322 | 10 |
| 4 | Standoff, nylon, 1" | 561-K61.00 | 100 |
| 1 | Grommet, rubber | 534-739 | 10 |
| 4 | Standoff, nylon .5" | 561-K6.50 | 100 |
| 4 | Bumper, rubber | 534-721 | 40 |
| 1 | clip (ground) | 548-46A-B | 10 |
| 1 | sub D connector (plug) | 538-DEU 9P | 10 |
| 1 | sub D connector (socket) | 538-DEU 9S | 10 |
| 8 | spade tongue terminal (red) | 538-19144-0003 | 80 (#6 spade lug terminal) |
| | Flat cable, .050" 20 c stranded (4 foot flat cable per analyzer) | 566-9L28020 | 100 ft. roll |
| | SEMICONDUCTORS | | |
| 10 | Quad 2-Input NAND Gate CMOS | 512-MM74HC00N | 100 |
| 4 | Hex Converter High Speed CMOS | 512-MM74HC4050N | 40 |

| Quantity | | Allied part # | (extended quality for 10) |
|---|---|---|---|
| 20 | LED, 5 V red, 6" wire leads | 265-5031 | 200 |
| 1 | Header, shrouded, 20 pin | 512-2630 | 10 |
| 1 | IDC connector, dual row 20 pin | 618-8906 | 10 |
| 1 | IDC connector strain relief | 618-8932 | 10 |

| Quantity | | Texas Circuitry Inc. part # |
|---|---|---|
| 1 | Printed Circuit Board | 200306-SE ($45 ea, $60 for 2, $200 for 10) |

Miscellaneous Parts
1 breadboard. RadioShack Dual PC Board part #276-148 (breaks in half making 2).
1 Wire Markers (self-adhesive) RadioShack part #2781650A (or equivalent)
1 handle, (3 inch length) Home Depot part #P604BAC
  Lowe's part #PW353-26D (The supplied screws are too long. Either cut them in half or replace with ½" #8 screws.)
1 ea 100 ohm 5%, ¼ watt resistor.
2 ea Velcro cable ties (6 per pack) Walmart #F8B024-WM (in electronics department)
Screws, washers, nuts
  14 ea 4/40×⅜" Phillips head machine screw with flat, split and hex nut.
  4 ea 6/32×2" Phillips head machine screw with flat, split and hex nut.
  4 ea #8×⅜" pan head sheet metal screw. When completed, discard the 4 screws supplied with the metal enclosure and force these into the 4 cover mounting holes.
  2 ea terminal solder lug #4 screw size
  1 ea terminal solder lug (yellow) #8 screw size #12 wire size.
  1 ea support clamp, ¼" size, ¼" diameter ACE Hardware part #CLC-4. Used to secure the Mark 1F harness to the case so it won't get lost.
Wiring, internal to unit, 22 ga. stranded.
  Brown 8"×8 wires (for Mark 1F pad connections on card to sub D connector)
  Red, VCC, Mark 20/Mark 1F switch, 20"
  Black GND, 12"
  Yellow, RESET switch, 8"

External Mark 1F cable uses 24 feet. (8 wires 3 feet long) 22 ga stranded wire.

External Ground wire for unit is 4 feet of 12 ga stranded wire.

20 conductor stranded ribbon cable (listed in Mouser parts above) 4 feet length.

The example embodiment of a 20-antenna version of the present invention may be assembled as follows:
  Case layouts (FIGS. 5-10), circuit board layouts (FIGS. 11-13), and photographs (FIGS. 14-18) of the example embodiment of the present invention are included. There is a manufactured circuit card (See parts list, above) that may dictate the size of the sheet metal case, and the circuit card must be mounted and connected in the case as described below to insure correct operation of this embodiment of the present invention and to prevent damage to the Localizer equipment.

Drawings of all sides of the box are included in FIGS. 5-10. These figures may be scanned, resized as desired, and printed-out. Cut around the border, and tape the drawings to the metal case. Mark with a scribe then drill and de-burr all holes, and cut all openings in the case. The two slots on the right hand side need to be drilled first and filed to size. Suggest using a 9-pin sub D connector to check the fit to prevent filing too far. The slot for the 20-pin header also needs to be cut here.

One hard part is to cosmetically get the 20 LEDs lined up in a straight double row. One way is to mark the holes on the drawing, drill a small hole, and then drill a bigger hole using a 0.156" drill bit. A better method is to take a piece of breadboard wide enough to reach from the handle to the LED holes. Mount it under the handle then mark off 20 holes and use the breadboard for a drill guide for a 0.060" drill bit or smaller, followed by a 0.156" bit. Install the top handle and all three switches. The RESET switch may have a plastic tab that needs to be filed off so it will sit flush. Install the sub D connector socket on the right side using two each 4/40×⅜" screws with flat, split, and hex nut.

Figure 11:
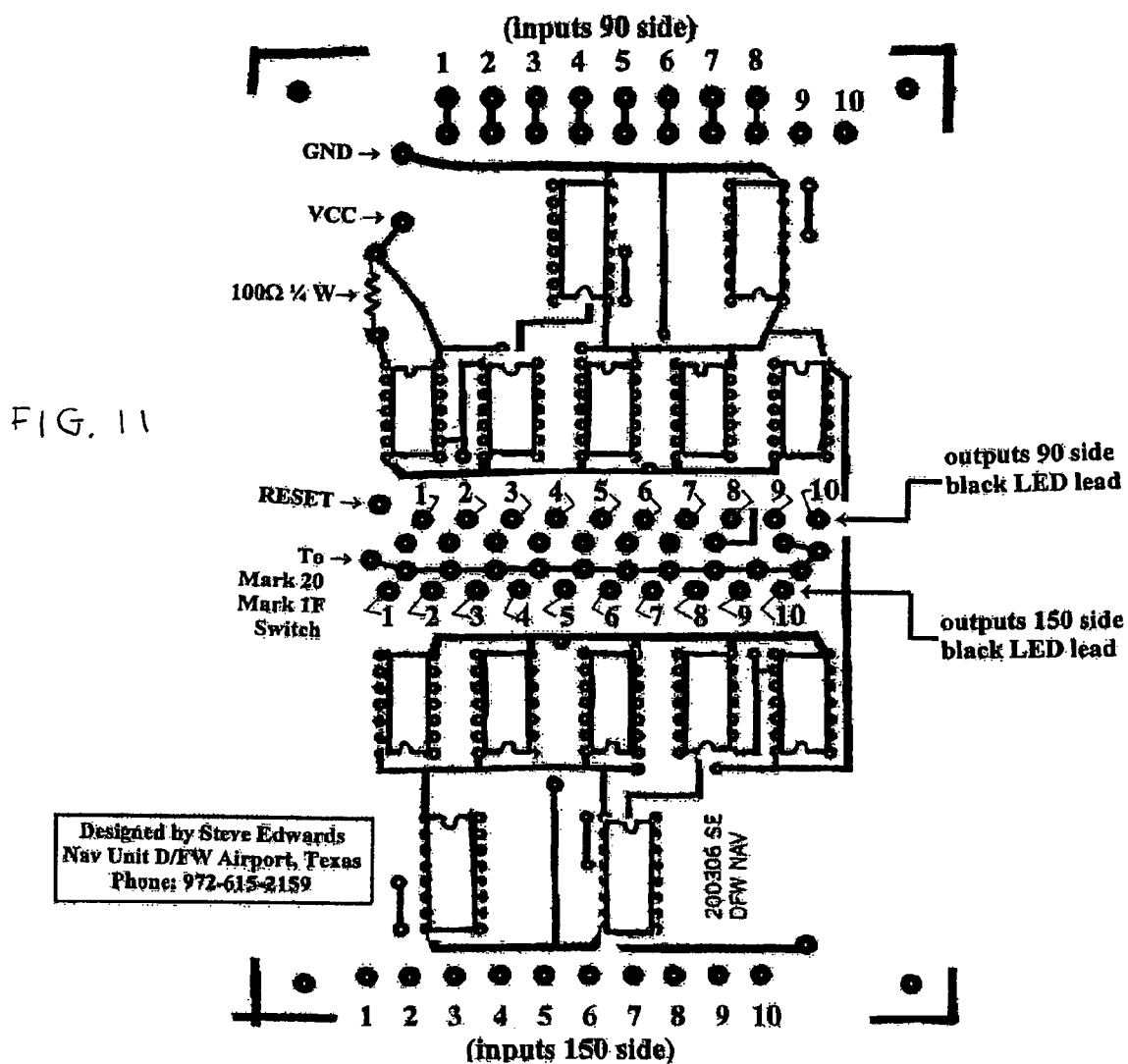
FIGS. 11 through 13 are circuit board layouts for a 20-antenna example embodiment of the present invention.
Figure 12:
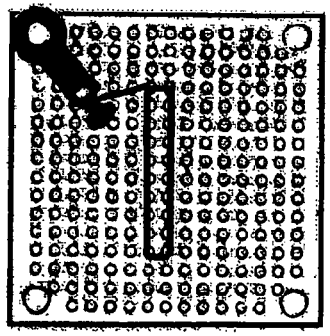
Figure 13:
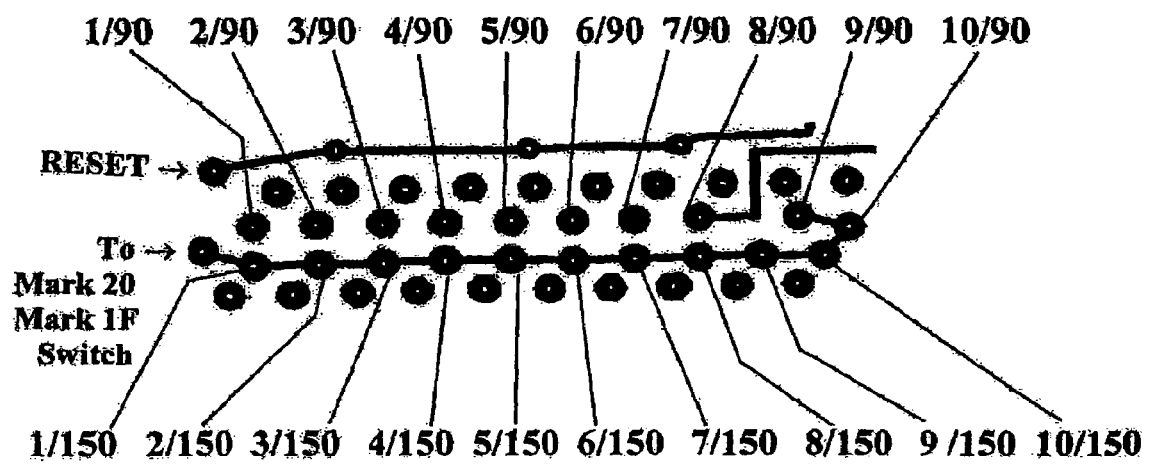
Figure 14:
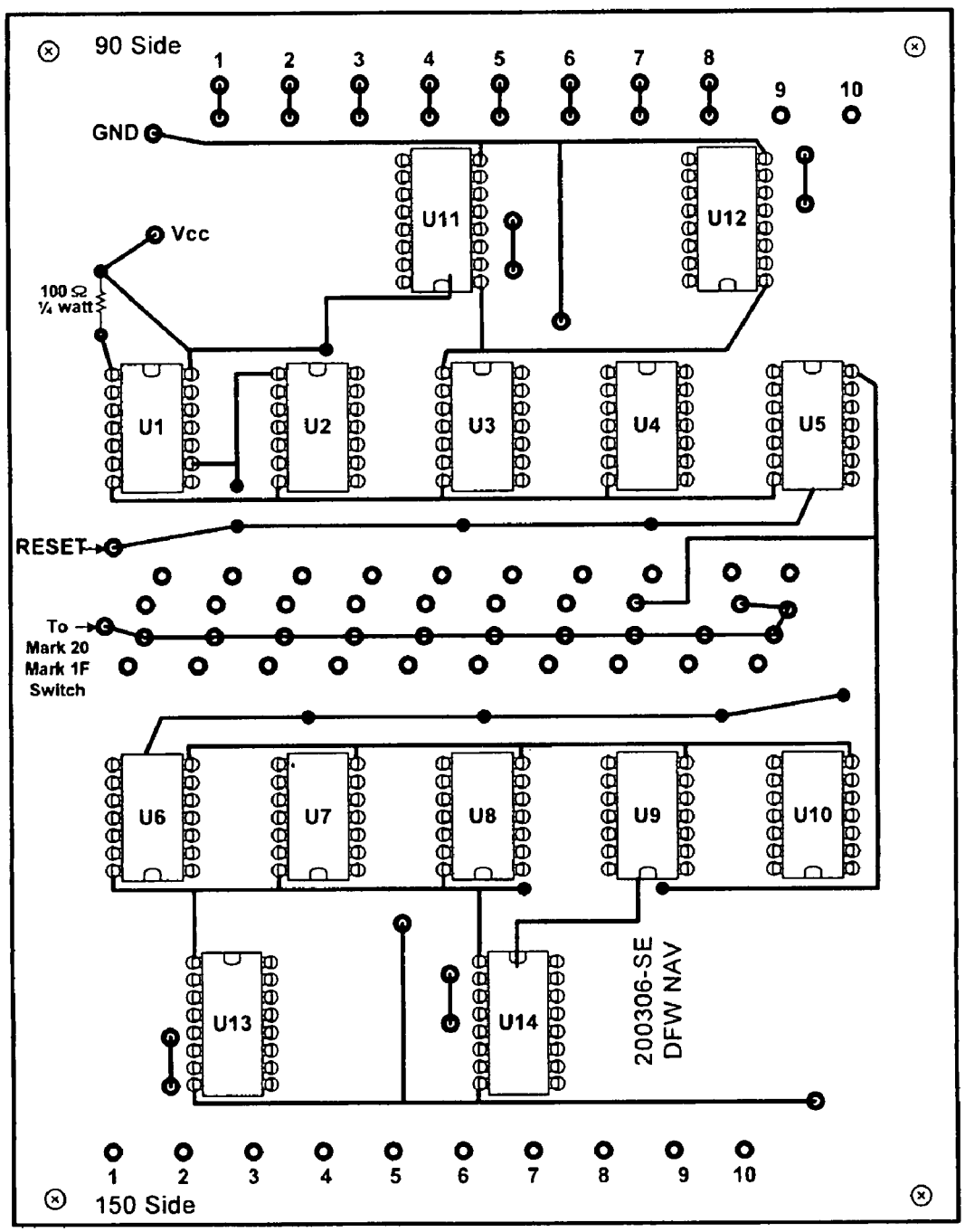
FIGS. 14 through 18 are photographs of a 20-antenna example embodiment of the present invention.
Figure 15:
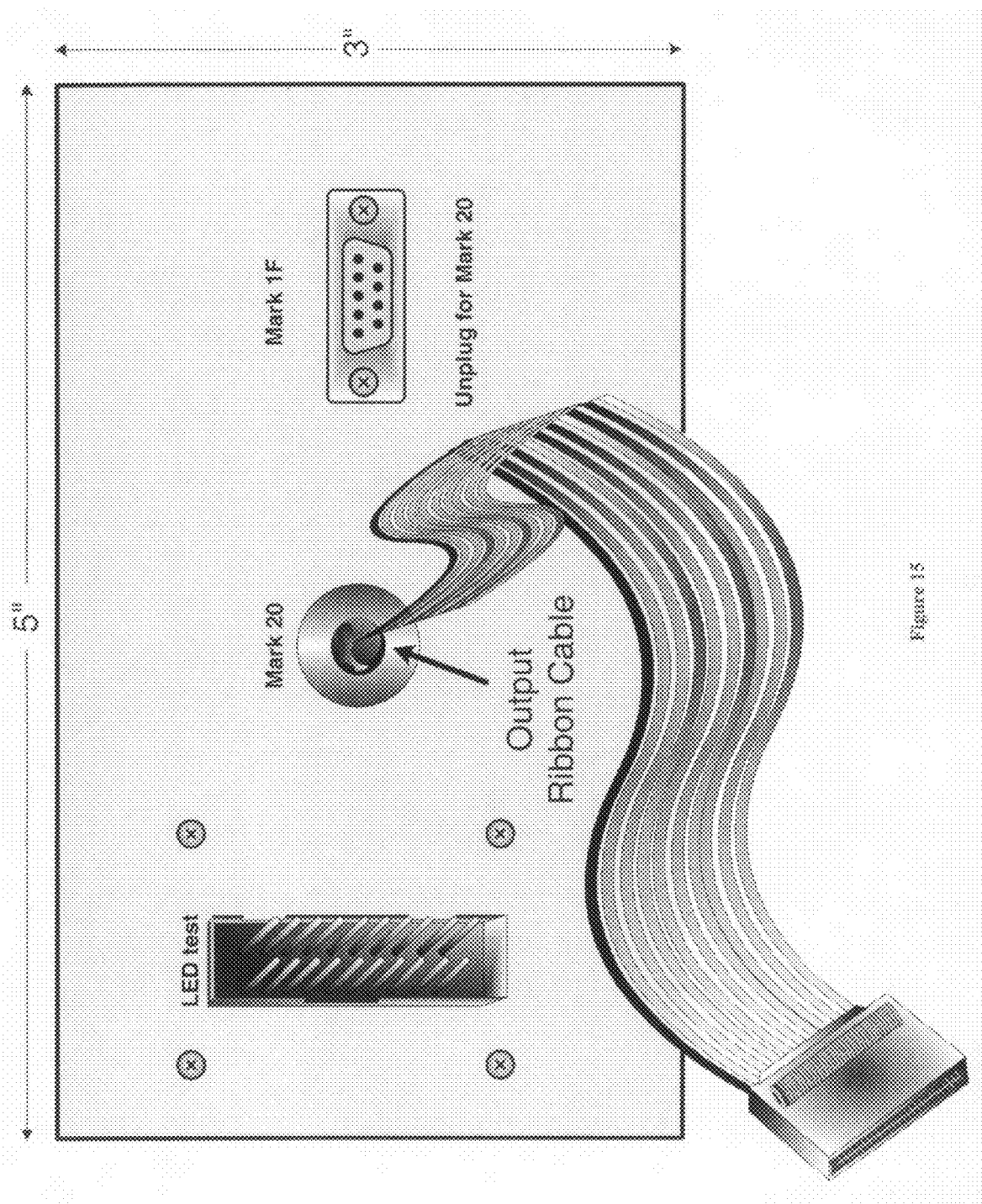

The artwork for the front side of the circuit card is shown in FIGS. 11 and 13 with the IC positions, resistor, and all wire connection identifiers added in. Orientation is with part number 200306 SE near the bottom right. FIG. 15 is a picture of the finished circuit card. All pin 1 locations are marked with a white dot.

Install all 14 ICs and the resistor on the circuit card. Mount all the components of the front side of the card. There are two different types of ICs on the board, ten ICs having 14-pins and four having 16-pins. The 16-pin ICs go on the outside edges next to the inputs. All of the 14-pin ICs line up in the center next to the outputs. Verify the notch at pin 1 on each IC is in accordance with FIG. 11. After all the components have been soldered, clean the board with alcohol and set it aside.

LED test port. Mount the 20-pin header (Allied part no. 512-2630) on the breadboard in the location shown in FIG. 12 with the pins coming through the solder pad side. Solder a piece of bus wire around all 20 pins and solder to the ground lug in the position shown in FIG. 12. Mount the breadboard on the inside of the analyzer with the 20-pin header protruding through the slot using four each 4/40×⅜" screws with flat, split, and hex nut.

All input wires, switch wires, output LED wires pass through the backside and solder to the front side of the circuit card. When complete, the circuit card is mounted in the enclosure with the component side showing and all the wires gathered and hidden behind the circuit card. as shown in FIG. 15.

D-cell battery holder. Hold the end with the wires and using a pair of dikes, snip some plastic from the slot at the end of the center separation, and pass the red lead through to the negative compartment. Loosely mount the plastic case to the analyzer with four each 4/40×⅜" machine screws. Mark the case then remove it, and drill a hole in the plastic in the same place as the hole in the analyzer box. Pass both black and red leads through the hole to the inside of the case. Mount the battery holder to the case with a machine screw, flat washer, flat, split, and hex nut. Place a ground lug on the inside of the analyzer case under the flat washer on one of the screws. On the reverse side, slip a small one inch long piece of heat shrink over the leads and up through the hole and shrink to prevent the leads from shorting to the case. Solder the black lead to the ground lug, and solder the red lead to one of the POWER switch terminals.

POWER switch. From the second terminal, solder an eight-inch 22-gauge stranded wire to the $V_{cc}$ pad on the circuit card. Solder a second four-inch wire from the same switch terminal to one terminal on the 14/20-antenna (Mark 20)/8-antenna (Mark 1F) switch. (See FIG. 16)

14/20-antenna (Mark 20)/8-antenna (Mark 1F) switch. Solder an eight-inch red 22-gauge stranded wire from the other terminal to the 14/20-antenna/8-antenna pad on the circuit card. Position this switch on the analyzer where the ON position is pointing to the 14/20-antenna (Mark 20) position.

RESET switch. This is a momentary contact push button switch that grounds all of the input pins with the RESET function. Solder a black wire from one terminal of the switch to a ground lug. Solder a yellow eight-inch 22-gauge stranded wire to the other terminal and to the RESET pad on the circuit board. (See FIG. 16.)

Ground wire. Cut a four-foot length of black 12-gauge stranded wire. Crimp and solder one end to a solder lug (yellow). Mount this lug under one of the screws on the handle. Pass the other end of the wire completely through the rubber grommet and crimp (remove the black plastic insulators from the clip before soldering and be sure to put one over the wire before crimping) and solder the ground clip (Mouser part #548-46A-B) to the other end. Connect an eight-inch piece of 22-gauge black wire from a ground lug to the GND pad near the top left of the circuit card. (See FIG. 16.)

LEDs. Install the twenty LEDs into the case using a ¼" nut driver pushing only on the rim of the LED.

Ribbon cable installation. Cut a four-foot length of 20-wire flat ribbon cable. On one end, separate all wires six inches back and strip ¼" from the end. Beginning with wire #1 (marked with either a red or black stripe) solder to the circuit board as follows. (Pass the wires through the back and solder to the front of the circuit board.) Notice each side uses every other wire, i.e.,

| LED 90 | 1 | 1 (wire marked in red or black) |
|---|---|---|
| | 2 | 3 |
| | 3 | 5 |
| | 4 | 7 |
| | 5 | 9 |
| | 6 | 11 |
| | 7 | 13 |
| | 8 | 15 |
| | 9 | 17 |
| | 10 | 19 |

| LED 150 | 1 | 2 |
|---|---|---|
| | 2 | 4 |
| | 3 | 6 |
| | 4 | 8 |
| | 5 | 10 |
| | 6 | 12 |
| | 7 | 14 |
| | 8 | 16 |
| | 9 | 18 |
| | 10 | 20 |

Pass the other end of the ribbon cable through the rubber grommet on the right side of the analyzer box then slip a Velcro® cable tie over the end of the cable. Take a black marker and mark UP ↑ on both sides of the ribbon cable pointing to wire #1 about two inches from the end. Next, install a UDC connector to the end of the ribbon cable. Position the cable inside the connector, and then put it in a vise and force the connector together. Fold the ribbon cable back over the connector and snap the strain relief on the connector. (See FIG. 17.)

For the 8-antenna (Mark 1E/F) function, cut eight 22-gauge stranded cables eight inches in length. Strip and solder one end to pads 1-8 on the top row on the 90 input side. Terminate each wire with a female pin and then insert into holes 1-8 on the sub D connector on the right side of the analyzer. Verify that the sub D pins 1-8 connect to pads 1-8 on the 90 input side. (See FIG. 16.)

Figure 16:
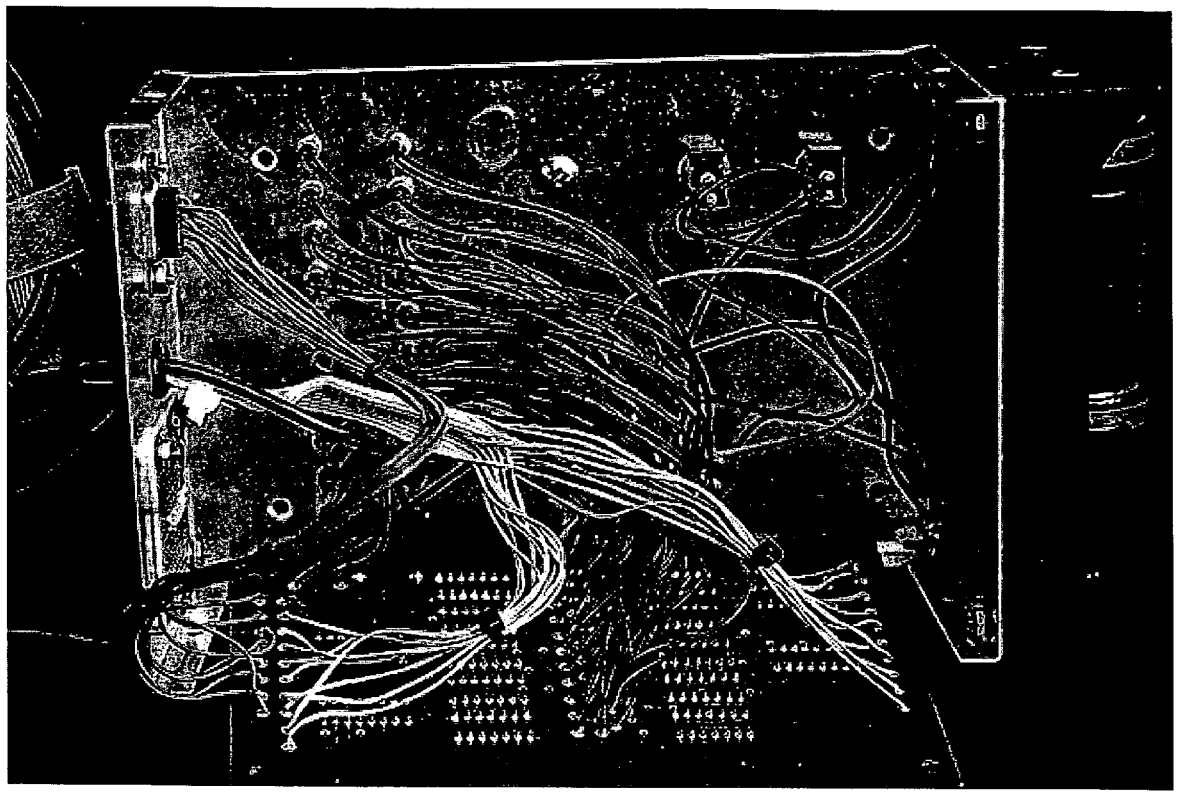
Figure 17:
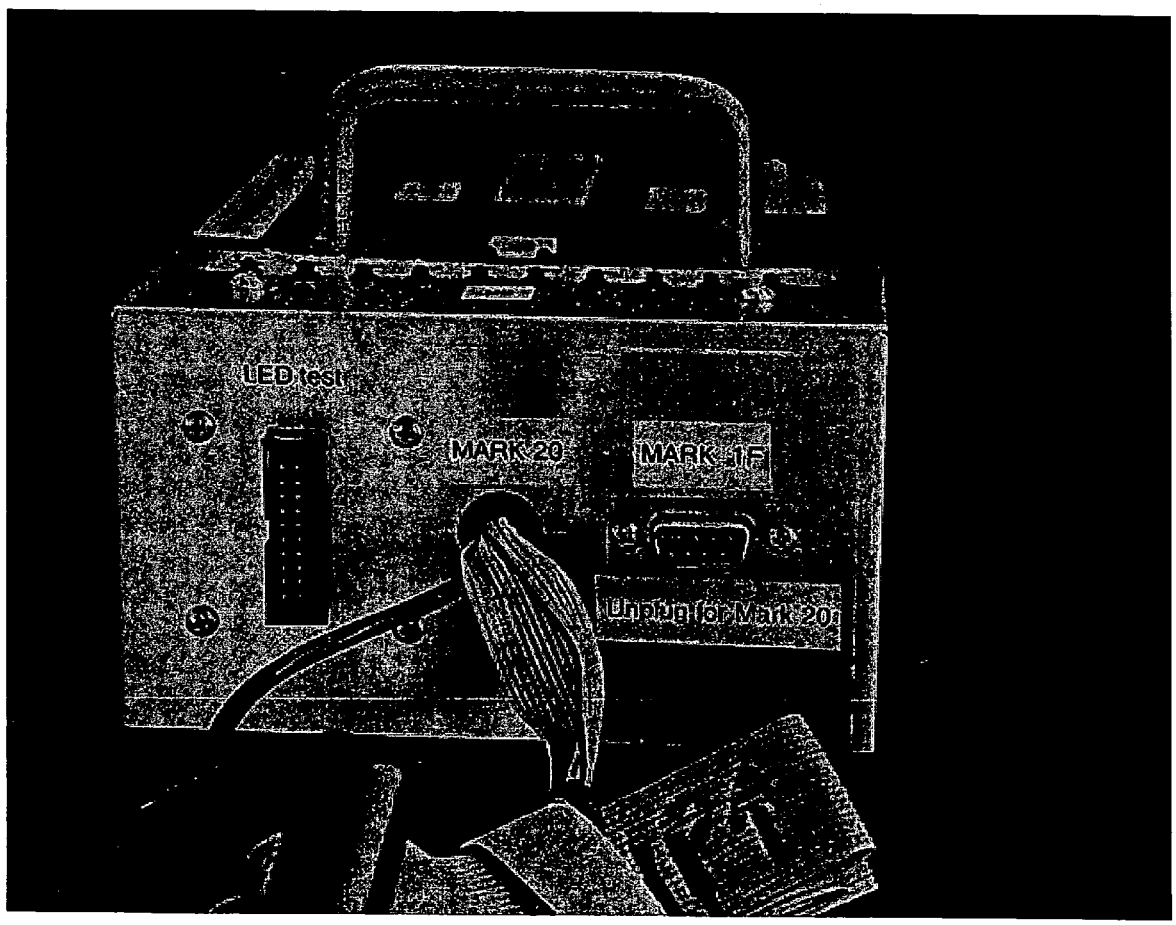
Figure 18:
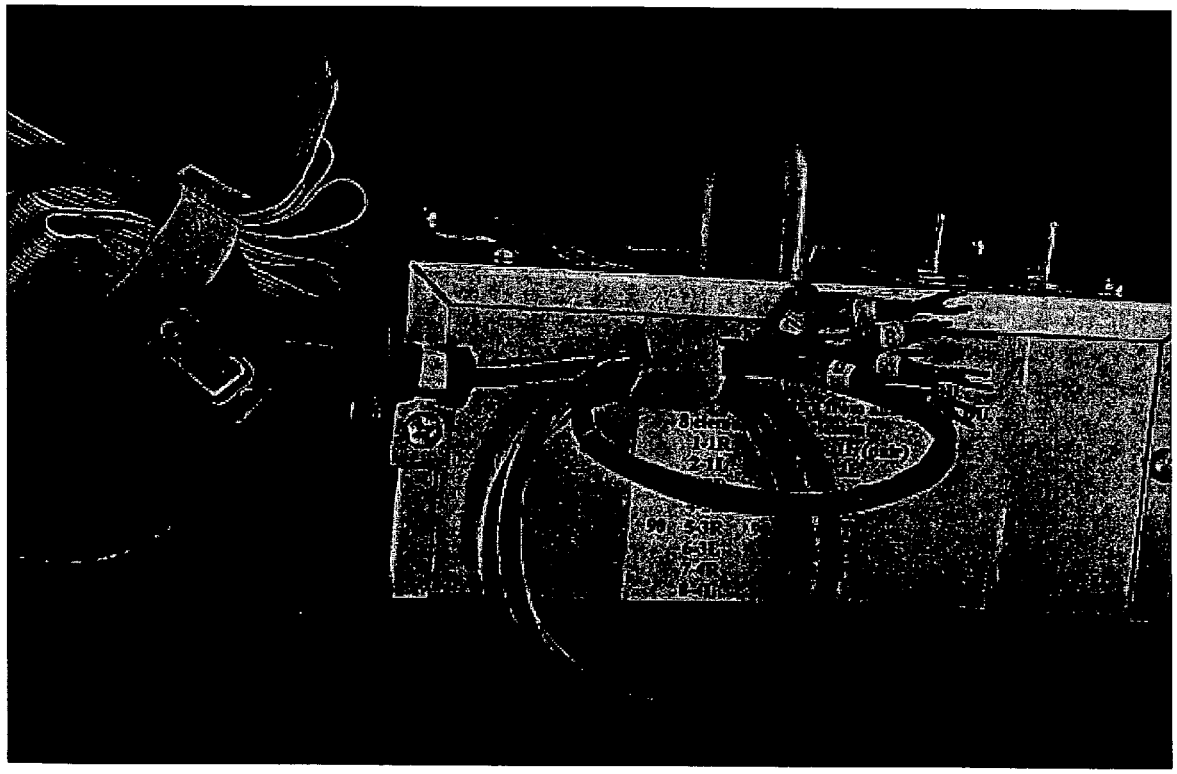

Now the LED wires can be soldered. The LED black wire locations are numbered on the circuit card drawings, FIGS. 11 and 13. As shown in FIG. 16, all LED wires pass through the backside of the circuit board and solder to the front. The output portion from the center of the circuit card is shown in FIG. 13. The LED red wires solder to the pads as shown.

Start with the 1/90 and solder the black 90 LED outputs first, the red 90s, then the red 150s, and then the black 150s. After the LED leads are soldered, solder the VCC, GND, RESET and Mark 20(14/20-antenna)/Mark 1F(8-antenna) switch wires from the chassis then mount the circuit card into the enclosure using four 6/32×2" screws. On the back, install 1" and 0.5" Teflon® spacers on each screw, then the circuit card, and then a flat, split, and hex nut. (See FIG. 15.) Clean the front side of the circuit card with alcohol.

Mount the four rubber feet on the bottom of the case using four 4/40 screws with flat, split, and hex nut. One may put a flat washer under the screw before going through the rubber feet. Assemble the case using four #8×⅜" sheet metal screws.

8-antenna (Mark 1E/F) cable instructions: Cut eight lengths of 22-gauge stranded wire three feet long. Crimp and solder one end to a red spade terminal. Attach a wire number 1-8 on each terminal. Cover each terminal with a half-inch length of ¼-inch clear heat shrink to protect the number. Insert all eight wires into a 32-inch long ¼-inch heat shrink. Terminate the other end of the wires with a male end of a 9-pin sub D connector (plug), and insert the wires into the proper holes on the D connector. Slip a Velcro® tie over harness at the spade lug end then slide to the sub D connector end. Roll up the harness and attach it to the case with a clip. (See FIG. 18.)

Validation. Connect a 20-pin connector to the LED test port and apply power. Verify the 14/20-antenna (Mark 20)/8-antenna (Mark 1F) switch is in the 14/20-antenna (Mark 20) position. This tests the IDC connector, ribbon cable, inner connections, logic gates, and LEDs. If all the LEDs light, the unit is validated and ready for use.

I claim:

1. A cable fault analyzer having a plurality of detection and capture circuits coupled to a plurality of antennas in a Localizer antenna array, each said detection and capture circuit comprising:
   a. A digital latch circuit comprising:
      i. a first input,
      ii. a second input coupled to a monitoring terminal on said Localizer antenna array, and
      iii. an output;
   b. A reset switch comprising:
      i. a common terminal coupled to said first input of said latch circuit,
      ii. a normally closed terminal coupled to a voltage source to apply a predetermined voltage to bias said latch circuit into a detection and capture mode, and
      iii. a normally open terminal coupled to ground to apply ground to reset said latch circuit;

c. An indicator device coupled to said output of said latch circuit to signal the detection and capture of a fault in an antenna in said Localizer antenna array; and d. A buffer circuit coupled between said second input on said latch circuit and said monitoring terminal on said Localizer antenna array.

2. The cable fault analyzer of claim 1 further comprising a circuit where a switch can be selected to enable or disable unused said indicator devices.

3. A cable fault analyzer having a plurality of detection and capture circuits coupled to a plurality of antennas in a Localizer antenna array, each said detection and capture circuit comprising:

a. A latch circuit comprising:
   i. a pair of cross coupled NAND gates,
   ii. a first input,
   iii. a second input coupled to a monitoring terminal on said Localizer antenna array, and
   iv. an output;

b. A reset switch comprising:
   i. a common terminal coupled to said first input of said latch circuit,
   ii. a normally closed terminal coupled to a voltage source to apply a predetermined voltage to bias said latch circuit into a detection and capture mode, and
   iii. a normally open terminal coupled to ground to apply ground to reset said latch circuit;

c. An indicator device coupled to said output of said latch circuit to signal the detection and capture of a fault in an antenna in said Localizer antenna array; and d. A buffer circuit coupled between said second input on said latch circuit and said monitoring terminal on said Localizer antenna array.

4. The cable fault analyzer of claim 3 further comprising a circuit where a switch can be selected to enable or disable unused said indicator devices.

* * * * *